United States Patent
Jin et al.

(10) Patent No.: US 11,516,950 B2
(45) Date of Patent: Nov. 29, 2022

(54) ELECTRONIC DEVICE COMPRISING DISPLAY MODULE HAVING STRESS NEUTRALIZATION LAYER BETWEEN FLEXIBLE SUBSTRATE AND CONDUCTIVE LAYER

(71) Applicant: Samsung Electronics Co., Ltd., Gyeonggi-do (KR)

(72) Inventors: Gyeongmin Jin, Gyeonggi-do (KR); Min Park, Gyeonggi-do (KR); Jaedeok Lim, Gyeonggi-do (KR); Jungje Bang, Gyeonggi-do (KR); Jaeheung Ye, Gyeonggi-do (KR); Yongwon Lee, Gyeonggi-do (KR); Seyoung Jang, Gyeonggi-do (KR)

(73) Assignee: Samsung Electronics CO., LTD., Suwon-si (KR)

( * ) Notice: Subject to any disclaimer, the term of this patent is extended or adjusted under 35 U.S.C. 154(b) by 140 days.

(21) Appl. No.: 16/766,363

(22) PCT Filed: Nov. 19, 2018

(86) PCT No.: PCT/KR2018/014167
§ 371 (c)(1),
(2) Date: May 22, 2020

(87) PCT Pub. No.: WO2019/103414
PCT Pub. Date: May 31, 2019

(65) Prior Publication Data
US 2020/0383247 A1    Dec. 3, 2020

(30) Foreign Application Priority Data

Nov. 24, 2017 (KR) .......................... 10-2017-0158377

(51) Int. Cl.
*H05K 9/00* (2006.01)
*H05K 1/18* (2006.01)
(Continued)

(52) U.S. Cl.
CPC .............. *H05K 9/006* (2013.01); *H05K 1/189* (2013.01); *H01Q 1/243* (2013.01); *H01Q 1/44* (2013.01);
(Continued)

(58) Field of Classification Search
None
See application file for complete search history.

(56) References Cited

U.S. PATENT DOCUMENTS

2013/0050950 A1  2/2013  Hill et al.
2013/0233611 A1  9/2013  Malek et al.
(Continued)

FOREIGN PATENT DOCUMENTS

KR   10-0681759 B1   2/2007
KR   10-0770832 B1   10/2007
(Continued)

OTHER PUBLICATIONS

Notice of Preliminary Rejection dated Sep. 8, 2022.

*Primary Examiner* — Mukundbhai G Patel
(74) *Attorney, Agent, or Firm* — Cha & Reiter, LLC

(57) ABSTRACT

The disclosure provides an electronic device having an electromagnetic shielding structure for preventing an antenna performance degradation. The disclosed electronic device may include: an antenna disposed in some areas of the electronic device; a printed circuit board; and a display module including a display panel, one or more signal lines coupled to the display panel, and a flexible substrate on which the one or more signal lines are disposed. The flexible substrate may include: a conductive layer coupled to the
(Continued)

printed circuit board in a curved state and configured to shield an electromagnetic wave radiated from the one or more signal lines to the antenna; and a stress neutralization layer of which a material can be deformed over time in response to a shape of the flexible substrate coupled in a curved state. The stress neutralization layer may be disposed between the flexible substrate and the conductive layer.

15 Claims, 10 Drawing Sheets

(51) Int. Cl.
    *H01Q 1/24* (2006.01)
    *H01Q 1/52* (2006.01)
    *H04M 1/02* (2006.01)
    *H01Q 1/44* (2006.01)
(52) U.S. Cl.
    CPC .......... *H01Q 1/526* (2013.01); *H04M 1/0266* (2013.01); *H04M 1/0277* (2013.01)

(56) References Cited

U.S. PATENT DOCUMENTS

| | | |
|---|---|---|
| 2013/0286609 A1 | 10/2013 | Merz |
| 2015/0155614 A1* | 6/2015 | Youn .................. H04M 1/0202 343/702 |
| 2015/0310776 A1 | 10/2015 | Lee et al. |
| 2017/0047639 A1 | 2/2017 | Lee et al. |
| 2017/0318713 A1 | 11/2017 | Bang et al. |
| 2018/0131087 A1 | 5/2018 | Kim et al. |

FOREIGN PATENT DOCUMENTS

| | | |
|---|---|---|
| KR | 10-2015-0064566 A | 6/2015 |
| KR | 10-2015-0124542 A | 11/2015 |
| KR | 10-2017-0018682 A | 2/2017 |
| KR | 10-2017-0123747 A | 11/2017 |
| KR | 10-2018-0051173 A | 5/2018 |

\* cited by examiner

ELECTRONIC DEVICE COMPRISING DISPLAY MODULE HAVING STRESS NEUTRALIZATION LAYER BETWEEN FLEXIBLE SUBSTRATE AND CONDUCTIVE LAYER

CROSS REFERENCE TO RELATED APPLICATIONS

This application is a National Phase Entry of PCT International Application No. PCT/KR2018/014167, which was filed on Nov. 19, 2018, and claims a priority to Korean Patent Application No. 10-2017-0158377, which was filed on Nov. 24, 2017, the contents of which are incorporated herein by reference.

TECHNICAL FIELD

Various embodiments of the disclosure relate to an electronic device having an electromagnetic shielding structure.

BACKGROUND ART

In a portable electronic device such as a smartphone, a plurality of antennas of various forms may be mounted to secure convenience of a wireless network access.

For example, the electronic device may have an antenna disposed at a suitable place to have access to wireless networks each having a different frequency band, such as NFC, Bluetooth, wireless LAN, commercial wireless networks (e.g., 3G, 4G mobile communication networks), or the like.

DISCLOSURE OF INVENTION

Technical Problem

Such a high-performance electronic device has a plurality of electronic components mounted on a printed circuit board with a high degree of integration. A variety of integrated circuit(s) with a high degree of integration may produce more electromagnetic waves, and an electromagnetic interference may result in a degradation of an overall operation performance of the integrated circuit(s) and/or the electronic device.

In addition, in a small-sized electronic device which tends to be slimmer gradually, integrated circuit chips may be disposed more densely, and may be disposed adjacent to an antenna (e.g., a radiating conductor). The arrangement of the integrated circuits and/or the antenna device may result in a degradation of operation performance of the integrated circuit chip or an operation environment of the antenna.

For example, an electronic device having a plurality of antennas mounted thereon according to a bandwidth may have a problem in that antenna performance is degraded due to a noise generated from a plurality of electronic components since a distance between the antenna and a display panel is very close.

Solution to Problem

Various embodiments of the disclosure may provide an electronic device having an electromagnetic shielding structure capable of preventing an antenna performance degradation by reducing or preventing an electromagnetic interference between integrated circuit chips and/or between integrated circuit chip(s) and an antenna.

Various embodiments of the disclosure may provide an electronic device capable of preventing a damage of a mounted electromagnetic shielding structure (e.g., a crack of a shielding member).

An electronic device according to various embodiments of the disclosure may include: a printed circuit board; and a display module including a display panel, one or more signal lines coupled to the display panel, and a flexible substrate on which the one or more signal lines are disposed. The flexible substrate may include a conductive layer coupled to the printed circuit board in a curved state and configured to shield an electromagnetic wave radiated from the one or more signal lines to the antenna; and a stress neutralization layer of which a material can be deformed over time in response to a shape of the flexible substrate coupled in a curved state. The stress neutralization layer may be disposed between the flexible substrate and the conductive layer.

An electronic device according to various embodiments of the disclosure may include: a housing including a first cover disposed in a first direction, a second cover facing a second direction opposite to the first direction, and a plurality of side members disposed in a third direction perpendicular to the first and second directions, surrounding at least part of a space between the first and second covers, and constructed of a metal material in a segmented manner to operate as an antenna radiator; a display panel exposed to at least part of the first cover, and disposed at least in part to be adjacent to the side member; and an electromagnetic shielding structure constructed in a first portion of the display panel.

Advantageous Effects of Invention

An electronic device according to the disclosure suppresses or reduces a generated electromagnetic noise, thereby preventing a performance degradation of an antenna disposed adjacent to a display panel.

BEST MODE FOR CARRYING OUT THE INVENTION

Figure 1:
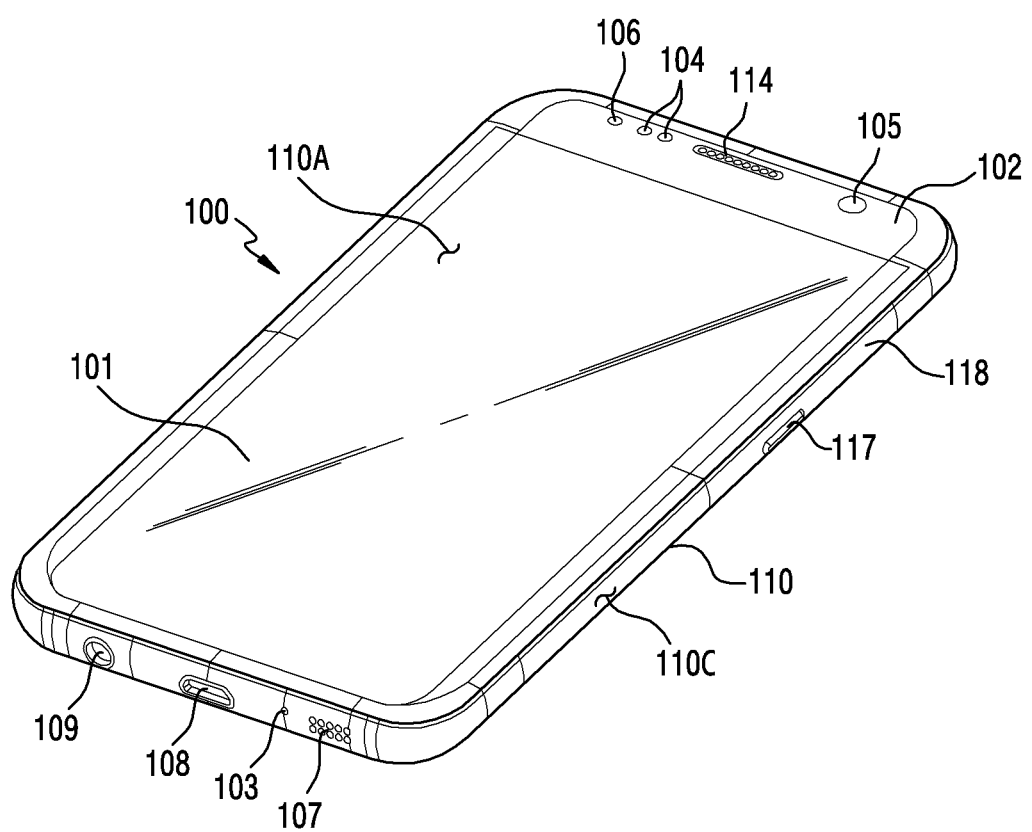
FIG. 1 is a front perspective view of an electronic device according to various embodiments.

Hereinafter, various embodiments of the disclosure are described with reference to the accompanying drawings. However, it should be appreciated that this is not intended to limit the technological features set forth herein to particular embodiments and include various changes, equivalents, or replacements for an embodiment of the disclosure. With regard to the description of the drawings, similar reference numerals may be used to refer to similar or related elements.

An electronic device according to various embodiments of the disclosure may include at least one of, for example, a smart phone, a tablet Personal Computer (PC), a mobile phone, a video phone, an e-book reader, a desktop PC, a laptop PC, a netbook computer, a workstation, a server, a Personal Digital Assistant (PDA), a Portable Multimedia Player (PMP), a MPEG-1 Audio Layer 3 (MP3) player, a mobile medical device, a camera, and a wearable device (e.g., smart glasses, a Head-Mounted Display (HMD), electronic clothes, an electronic bracelet, an electronic necklace, an electronic appcessory, an electronic tattoo, a smart mirror, or a smart watch).

Figure 2:
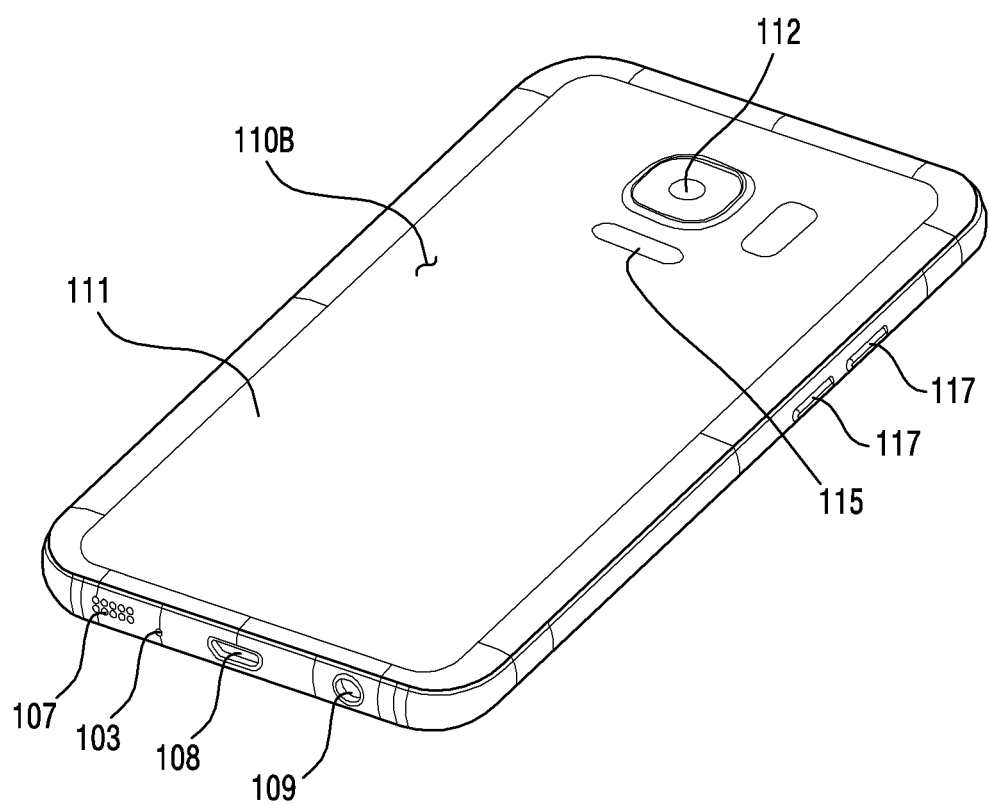
FIG. 2 is a rear perspective view of an electronic device according to various embodiments.

Referring to FIG. 1 and FIG. 2, the electronic device 100 according to an embodiment may include a housing 110 including a first face (or a front face) 110A, a second face (or a rear face) 110B, and a side face 110C surrounding a space between the first face 110A and the second face 110B. In another embodiment (not shown), the housing may refer to a structure constructing some of the first face 110A, second face 110B, and side face 110C of FIG. 1. According to an embodiment, the first face 110A may be constructed by a front plate 102 (e.g., a glass plate including various coating layers, or a polymer plate) of which at least part is substantially transparent. The second side 110B may be constructed by a rear plate 111 which is substantially opaque. The rear plate 111 may be constructed by, for example, coated or colored glass, ceramic, polymer, metal (e.g., aluminum, stainless steel (STS), or magnesium), or a combination of at least two of the these materials. The side face 110C may be combined with the front plate 102 and the rear plate 111 and may be constructed by a side bezel structure (or a side member) 118 including metal and/or polymer. In some embodiments, the rear plate 111 and the side bezel structure 118 may be constructed integrally, and may include the same material (e.g., a metal material such as aluminum).

According to an embodiment, the electronic device 100 may include at least one of a display 101, audio modules 103, 107, and 114, sensor modules 104 and 119, camera modules 105, 112, and 113, key input devices 115 and 117, an indicator 106, and connector holes 108 and 109. In some embodiments, at least one (e.g., the key input devices 115, 116, and 117 or the indicator 106) of the components may be omitted, or the electronic device 100 may additionally include other components.

The display 101 may be exposed through, for example, some portions of the front plate 102. The display 101 may be combined with or adjacent to a touch sensing circuit, a pressure sensor capable of measuring touch strength (pressure), and/or a digitizer for detecting a magnetic-type stylus pen.

The audio modules 103, 107, and 114 may include a microphone hole 103 and speaker holes 107 and 114. The microphone hole 103 may have a microphone disposed inside thereof to acquire an external sound, and in some embodiments, may have a plurality of microphones disposed to sense a sound direction. The speaker holes 107 and 114 may include the external speaker hole 107 and the call receiver hole 114. In some embodiments, the speaker holes 107 and 114 and the microphone hole 103 may be implemented as a single hole, or a speaker (e.g., a Piezo speaker) may be provided without the speaker holes 107 and 114.

The sensor modules 104 and 119 may generate an electrical signal or data value corresponding to an internal operating state or an external environmental state of the electronic device 100. The sensor modules 104 and 119 may include, for example, the first sensor module 104 (e.g., a proximity sensor) and/or second sensor module (not shown) (e.g., a fingerprint sensor) disposed to the first face 110A of the housing 110, and/or a third sensor module 119 (e.g., a Heart Rate Monitoring (HRM) sensor) disposed to the second face 110B of the housing 110. The fingerprint sensor may also be disposed to the second face 110B as well as the first face 110A (e.g., the home key button 115) of the housing 110. The electronic device 100 may further include at least one of sensor modules (not shown), for example, a gesture sensor, a gyro sensor, an atmospheric pressure sensor, a magnetic sensor, an acceleration sensor, a grip sensor, a color sensor, an IR sensor, a biometric sensor, a temperature sensor, a humidity sensor, and an illuminance sensor.

The camera modules 105, 112, and 113 may include the first camera device 105 disposed to the first face 110A of the electronic device 100, and the second camera device 112 and/or flash 113 disposed to the second face 110B. The camera modules 105 and 112 may include one or more lenses, an image sensor, and/or an image signal processor. The flash 113 may include, for example, an LED or a xenon lamp. In some embodiments, two or more lenses (wide angle and telephoto lenses) and image sensors may be disposed to one face of the electronic device 100.

The key input devices 115 and 117 may include the home key button 115 disposed to the second side 110B of the housing 110, and/or the side key button 117 disposed to the side face 110C of the housing 110. In another embodiment, the electronic device 100 may not include some or all of the aforementioned key input devices 115, 116, and 117, and the key input devices 115, 116, and 117 which are not included may be implemented in any other form such as a soft key or the like on the display 101.

The indicator 106 may be disposed, for example, to the first face 110A of the housing 110. The indicator 106 may provide, for example, state information of the electronic device 100 in an optical form, and may include an LED.

The connector holes 108 and 109 may include the first connector hole 108 capable of accommodating a connector (e.g., a USB connector) for transmitting/receiving power and/or data of an external electronic device and/or the second connector hole (e.g., earphone jack) 109 capable of accommodating a connector for transmitting/receiving an audio signal with respect to the external electronic device.

Figure 3:
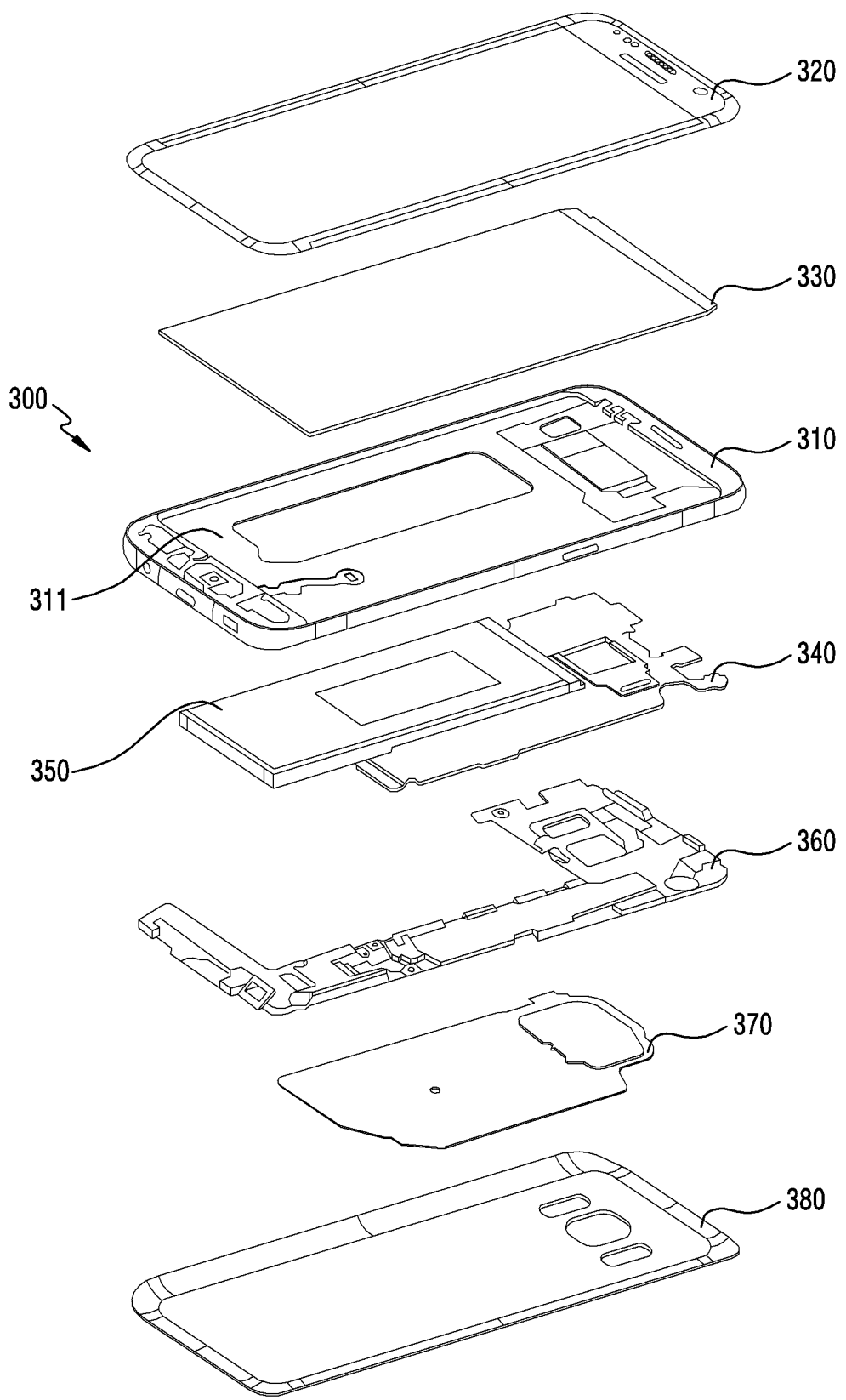
FIG. 3 is an exploded perspective view illustrating an inner structure of an electronic device according to various embodiments.

Referring to FIG. 3, an electronic device 300 may include a side bezel structure 310, a first support member 311 (e.g., a bracket), a front plate 320, a display 330, a Printed Circuit Board (PCB) 340, a battery 350, a second support member 360 (e.g., a rear case), an antenna 370, and a rear plate 380. In some embodiments, the electronic device 300 may omit at least one (e.g., the first support member 311 or the second support member 360) of these components, or may additionally include other components. At least one of the components of the electronic device 300 may be the same as or similar to at least one of the components of the electronic device 100 of FIG. 1 or FIG. 2, and redundant descriptions will be omitted hereinafter.

The first support member 311 may be coupled with the side bezel structure 310 by being disposed inside the electronic device 300, or may be integrated with the side bezel structure 310. The first support member 311 may be constructed of, for example, a metal material and/or a non-metal (e.g., polymer) material. The first support member 311 may have the display 330 joined to one face and the PCB 340 joined to the other face. A processor, a memory, and/or an interface may be mounted on the PCB 340. The processor may include, for example, one or more of a central processing unit, an application processor, a graphic processing unit, an image signal processor, a sensor hub processor, and a communication processor.

The memory may include, for example, a volatile memory or a non-volatile memory.

The interface may include, for example, a High-Definition Multimedia Interface (HDMI), a Universal Serial Bus (USB) interface, an SD card interface, and/or an audio interface. The interface may electrically or physically couple, for example, the electronic device 300 with an external electronic device, and may include a USB connector, an SD card/MMC connector, or an audio connector.

The battery 350 may be a device for supplying power to at least one component of the electronic device 300, and may include, for example, a primary cell which is not rechargeable, a secondary cell which is rechargeable, or a fuel cell. At least part of the battery 350 may be disposed, for example, to be substantially co-planar with the PCB 340. The battery 350 may be disposed inside the electronic device 300, and according to some embodiments, may be disposed to be detachable from the electronic device 300.

The antenna 370 may be disposed between the rear plate 380 and the battery 350. The antenna 370 may include, for example, a Near Field Communication (NFC) antenna, a wireless charging antenna, and/or a Magnetic Secure Transmission (MST) antenna. The antenna 370 may perform short-range communication, for example, with the external electronic device, or may wirelessly transmit/receive power required for charging. In another embodiment, an antenna structure may be constructed by at least part of the side bezel structure 310 and/or the first support member 311 or a combination thereof.

Hereinafter, a configuration of an electronic device having an electromagnetic shielding structure according to various embodiments of the disclosure will be described with reference to the accompanying drawings. In the description of the electronic device, a 3D rectangular coordinate system may be used. In the rectangular coordinate system, an X-axis may be a widthwise direction of the electronic device, a Y-axis may be a lengthwise direction of the electronic device, and a Z-axis may be a thickness direction of the electronic device.

Figure 4A:
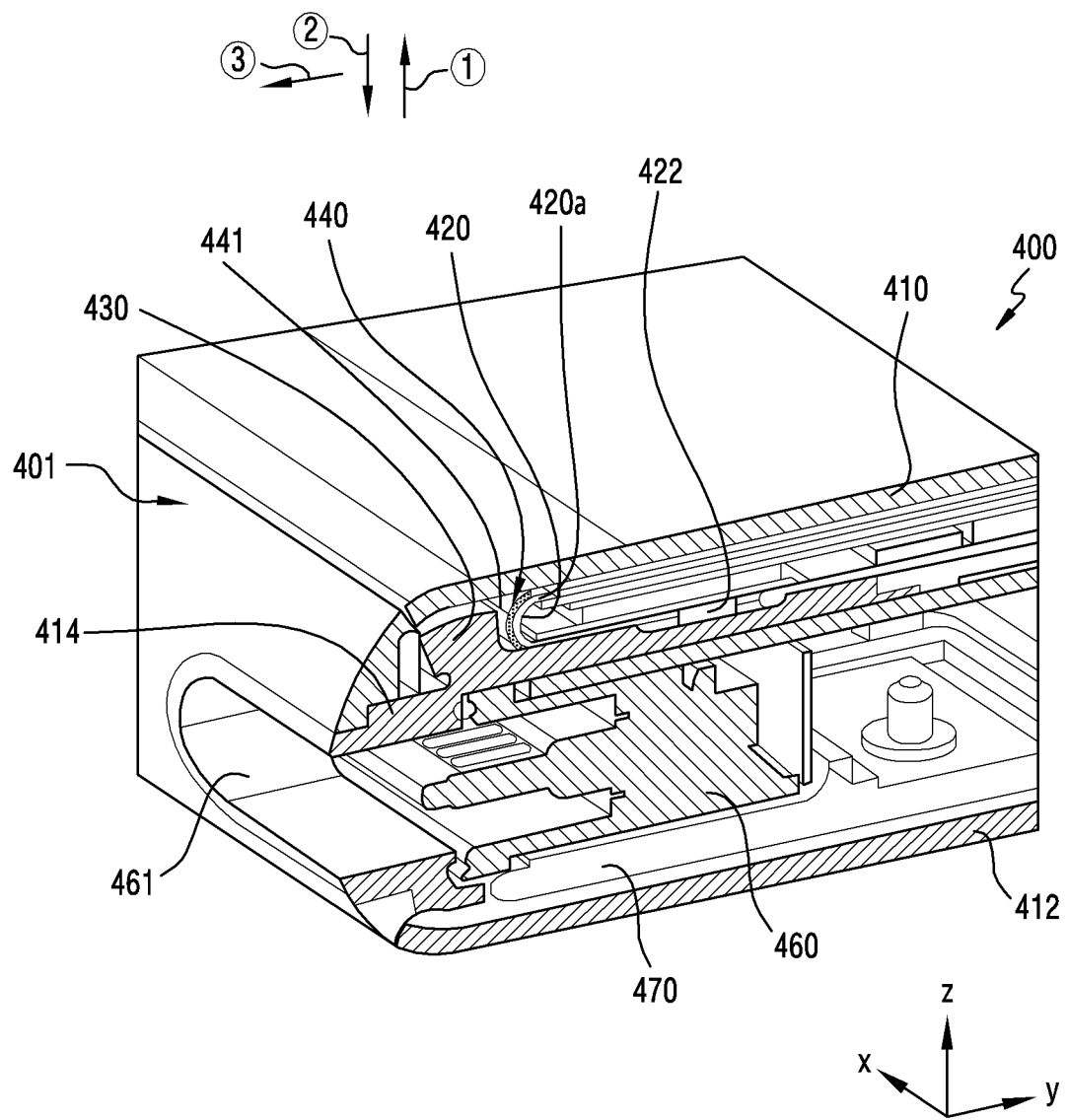
FIG. 4A is a partially cut perspective view of an electronic device having an electromagnetic shielding structure according to various embodiments of the disclosure.
Figure 4B:
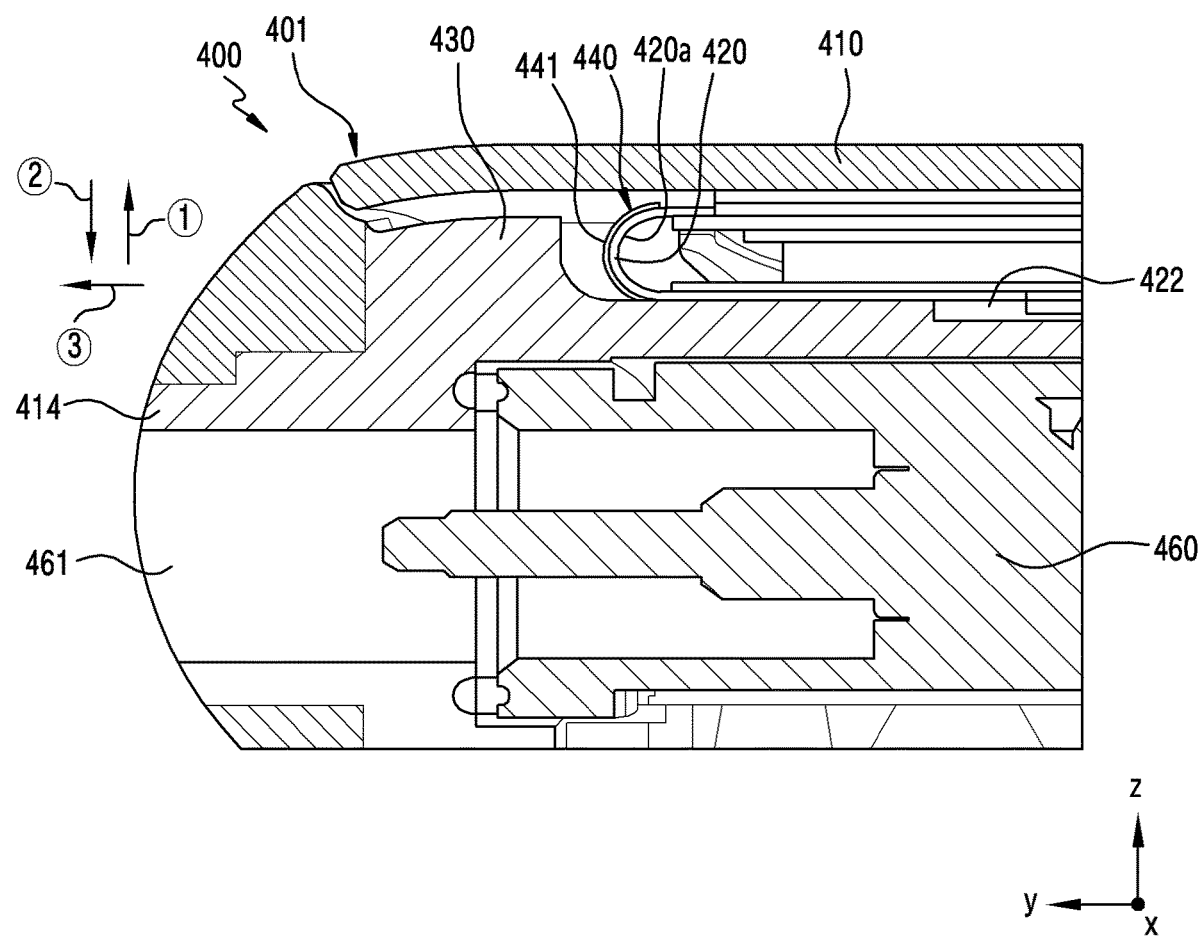
FIG. 4B is a cross-sectional view illustrating one side of the electronic device.

Referring to FIG. 4A or FIG. 4B, an electronic device 400 according to various embodiments may be an electronic device identical, at least in part, to the electronic devices 100 and 300 of FIG. 1 to FIG. 3. The electronic device 400 according to various embodiments may include a housing 401 on which various electronic components are mounted. Examples of the various electronic components may include a printed circuit board, a display panel, an antenna, an electronic part, a battery, or the like.

The housing 401 according to various embodiments may include a first cover 410 disposed to face a first direction ①, a second cover 412 disposed to face a second direction ② opposite to the first direction, and a side member 414 disposed to face a third direction ③ perpendicular to the first and second directions ① and ②, and surrounding at least part of a space between the first and second covers 410 and 412. According to an embodiment of the disclosure, the side member 414 may be an antenna 430 of FIG. 4A. For example, the first cover 410 may be an upper face of the electronic device 100, the second cover 412 may be a lower face of the electronic device 400, and the side member 414 may be a side face of the electronic device 400. In addition, the first cover 410 may be a transparent window of the electronic device 400, and the second cover 412 may be a rear cover of the electronic device 400. The side member 414 may be a side member disposed at the top of the housing 401, or a side member disposed at the bottom of the housing 401, or a side member disposed at one side or the other side between the top and bottom of the housing 401.

The side member 414 according to various embodiments may be constructed of a metal material, and may be constructed by using a plurality of exterior frames to operate as an antenna radiator. For this, the plurality of side members 414 may be constructed to have mutually segmented structures. The side member 414 disposed in such a structure may adjust a segment position, a position of a feeding point, or the like to adjust a bandwidth, may operate as a main antenna radiator or an auxiliary antenna radiator by being fed from a printed circuit board (not shown), and may serve as part of an exterior of the electronic device 400.

The electronic device 400 according to various embodiments may have at least one display panel 420 disposed thereon. For example, the display panel 420 may be disposed to be exposed to the first cover 410, second cover 412, or side member 414 of the housing.

The display panel 420 according to various embodiments may be disposed to be exposed in the first direction ① through at least part of the first cover 410. For example, the display panel 420 may be constructed of a rigid material or a flexible material. In addition, if the display panel 420 is constructed of the flexible material, the display panel 420 may be configured to be curved, rollable, or foldable. FIG. 4A illustrates the display panel 420 constructed of the flexible material. A reference numeral 422 may indicate a display driver.

In addition, the display panel 420 according to various embodiments may be constructed of a flat portion, a curved portion, or a combination of them. Although not shown, the display panel 420 according to various embodiments may be exposed to at least part of the second cover 412 of the housing 401, and may be exposed to at least part of the side member 414.

The at least part of the display panel 420 according to various embodiments may be disposed adjacent to the antenna 430 which is part of the side member located inside the housing. If the side member 414 is constructed of a metal material and disposed in a segmented shape along a perimeter of a side face of the housing to operate as an antenna radiator, the side member 414 may be the antenna 430. Hereinafter, the side member 414 operating as the antenna radiator is referred to as the antenna 430.

For example, the at least part of the display panel 420 may be disposed spaced apart from the antenna 430 to have a gap. For example, the gap may be in the range of about 1 to 1.5 mm. The display panel 420 may include a flexible substrate 420a, and the flexible substrate 420a may include at least one signal line. The display panel 420, the flexible circuit 420a, and the signal lines may be referred to as a display module.

The plurality of antennas 430 according to various embodiments may be disposed inside or outside the housing 401. For example, at least one antenna 430 may be disposed inside the housing 410 or on a side face of the housing 401, and at least one antenna 430 may be disposed to a top, bottom, or side area of the housing 401. For example, the antenna 430 may include any one of a conductive pattern type, a flexible circuit, a thin plate, and a metal frame.

The electronic device 400 according to various embodiments may have an electromagnetic shielding structure, that is, an electromagnetic shielding layer 440, in a first area of the housing 401 in order to prevent or reduce a performance degradation of the antenna 430 due to a noise generation of electromagnetic waves generated from various electronic components or the like. For example, the first area of the housing 401 may include a bottom portion or top portion of the housing 401 or at least part of a side portion, and may refer to a place adjacent to a connector 460 located at the top or bottom portion of the housing 401. In addition, the first area refers to a place adjacent to the side member 414 of the housing 401, and may include an area extending along the side member 414.

The electromagnetic shielding layer 440 according to various embodiments may be provided as a single shielding layer 441 on one face of the display panel 420 facing the antenna 430. The electromagnetic shielding layer 440 may be attached by being constructed of a film type having a specific thickness, or may be constructed on part of the display panel 420, for example, the flexible substrate 420a of the display panel.

For example, the electromagnetic shielding layer 440 may be constructed of a conductive layer. Electromagnetic waves radiated from the flexible circuit 420a of the display panel 420 toward the antenna 430 may be shielded.

In addition, the electromagnetic shielding layer 440 may be disposed on one face of the flexible substrate 421 of the display panel 420. In addition, the electromagnetic shielding layer 440 may be coupled to a printed circuit board in a curved manner.

For example, the electromagnetic shielding layer 440 of a film type may include an insulating layer, a shielding sheet, and a resin adhesive layer. The insulating layer may have a film shape having a thickness of about 5 to 8 micrometers (µm). The shielding sheet may be disposed on one face of the insulating layer, and may be constructed of an electrically conductive material layer having a thickness of about 2 to 10 µm. For example, the shielding sheet may be constructed of a copper foil having a specific thickness or a deposition layer on which a conductive material such as copper, gold, silver, or the like is deposited. The shielding sheet may be constructed by combining the copper foil and the deposition layer. The resin adhesive layer may include a thermoplastic resin adhesive to which an electrically conductive powder is added.

According to various embodiments, the resin adhesive layer may be denatured to an adhesive agent having viscosity when heated at a specific temperature or higher, and may be cured again to function as an adhesive layer when cooled. The resin adhesive layer may include epoxy resin or polyester resin.

The electromagnetic shielding layer 440 according to various embodiments may be disposed at a portion of the display panel 420, for example, at a perimeter portion of the display panel 420, and in particular, may be disposed adjacent to the side member 414 disposed at the bottom of the housing 401 or the connector 460 disposed at the bottom of the housing. In addition, the electromagnetic shielding layer 440 may be disposed to be stacked between the first cover 410 and the connector 460, and may be disposed on the connector 460.

The reference numeral 460 indicates a connector, and may be a USB connector disposed at the bottom of the housing. A reference numeral 461 may refer to a USB connector hole. The USB connector hole 461 may be constructed in the side member 414, and may be adjacent to the electromagnetic shielding layer 440.

Figure 5:
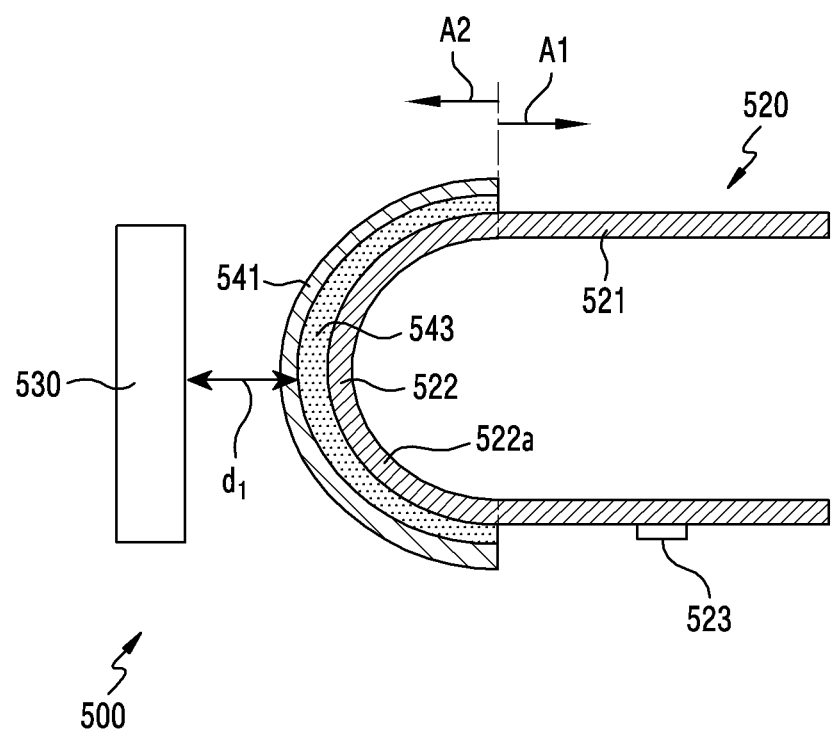
FIG. 5 is an exemplary view schematically illustrating an electromagnetic shielding structure according to various embodiments of the disclosure.

Referring to FIG. 5, a display panel 520 according to various embodiments may include a display area A1 and a non-display area A2 coupled in contact with the display area A1. For example, the display area A1 may be constructed of a flat portion, a curved portion, or a combination of them. In addition, the display panel 520 according to various embodiments may include at least one flat display portion 521 and at least one curved display portion 522.

Figure 4C:
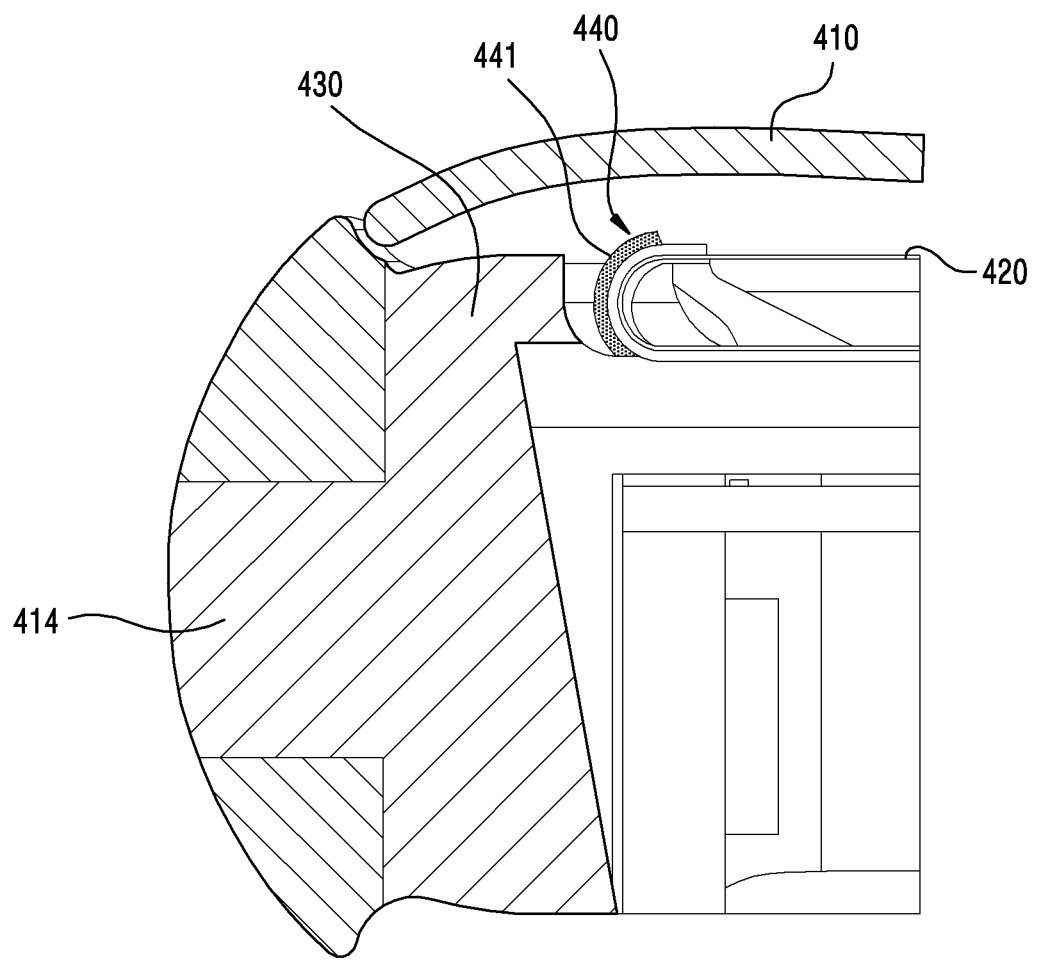
FIG. 4C is a cross-sectional view illustrating one side of the electronic device.

An electromagnetic shielding layer 541 (e.g., 440 of FIG. 4) according to various embodiments may be constructed in the non-display area A2 of the display panel. The electromagnetic shielding layer 541 may be constructed in the non-display area A2 in an attached or spray manner. For example, the electromagnetic shielding layer 541 may be constructed on an outer face of the non-display area A2.

In addition, the electromagnetic shielding layer 541 according to various embodiments may be constructed on at least part of the curved display portion 522 of the display panel. For example, the curved display portion 522 may be the non-display area A2.

In the electromagnetic shielding according to various embodiments, a stress neutralization layer 543 may be further provided between the display panel 520 and the electromagnetic shielding layer 541. For example, the stress neutralization layer 543 may be provided to prevent a damage, for example, a crack, of the electromagnetic shielding layer 541 provided on the display panel 520. When the electromagnetic shielding layer 541 is attached to the curved display portion 522 of the display panel, the electromagnetic shielding layer 541 may be cracked due to an elongation difference between outer and inner faces of the electromagnetic shielding layer 541. The stress neutralization layer 543 may prevent a crack on the electromagnetic shielding layer 541 or the display panel 520. A material of the stress neutralization layer 543 may be deformed over time in response to a shape of a flexible substrate 522a coupled in a curved state. The stress neutralization layer 543 may be disposed between the flexible substrate 522a and a conductive layer (e.g., the electromagnetic shielding layer 541).

The stress neutralization layer 543 according to various embodiments may be constructed of, for example, synthetic resin. The stress neutralization layer 543 may extend along the non-display area A2 of the display panel. In addition, the stress neutralization layer 543 may extend along the curved display portion 522 of the display panel. The stress neutralization layer 543 may have a thickness of about 0.1 mm. One face of the stress neutralization layer 543 may be attached to one face of the electromagnetic shielding layer 541, and the other face of the stress neutralization layer 543 may be attached to the flexible circuit 522a of the curved display portion 522 of the display panel. The electromagnetic shielding layer (e.g., conductive layer) 541 and the stress neutralization layer 543 disposed on the flexible substrate 522a of curved portions, for example, the curved display portion 522 of the display panel, may be configured to have a curvature or not have the curvature. A reference numeral 523 may be a chip for driving the display panel. A distance between an antenna 530 and the stress neutralization layer 543 may be in the range of about 1 to 1.5 mm.

Each manufacturing process for constructing an electromagnetic shielding layer of the disclosure will be described with reference to FIG. 6.

Figure 6:
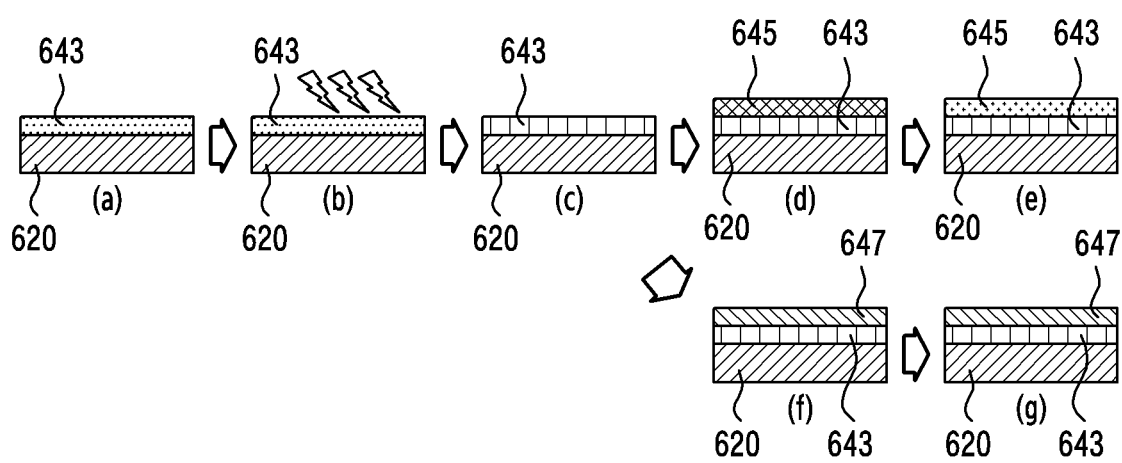
FIG. 6 is an exemplary view illustrating a manufacturing process of an electromagnetic shielding layer according to various embodiments of the disclosure.

A display panel shown in (a) of FIG. 6 may be the same as the display panel 520 of FIG. 5. Referring to (a) of FIG. 6, a stress neutralization material 643 may be the same as the stress neutralization layer 543 of FIG. 5. The stress neutralization resin material 643 may be applied to one face of a prepared display panel 620. The applied stress neutralization material 643 may be constructed in a layer shape.

Referring to FIG. 6B, the applied stress neutralization material 643 may be cured in a layer shape by high-speed ultraviolet irradiation. The cured stress neutralization material 643 is shown in (c) of FIG. 6. An ultraviolet curing process may be performed at a high speed.

Referring to (d) of FIG. 6, a layer 645 of an Ag paste material may be applied on the cured stress neutralization material 643 by dispensing the Ag paste. The layer 645 of the Ag paste material applied on the stress neutralization material 643 may be thermally cured at a low temperature, for example, below about 70 degrees Celsius (° C.) for about 30 minutes under a specific pressure, thereby manufacturing an electromagnetic shielding layer (e.g., 440 of FIG. 4 or 541 of FIG. 5). As the electromagnetic shielding layer (e.g., 440 of FIG. 4 or the 541 of FIG. 5), the layer 645 of the Ag paste material may be constructed to have a thickness of about 10 micrometers. A manufactured final electromagnetic shielding layer (e.g., 440 of FIG. 4 or 541 of FIG. 5) is illustrated in (e) of FIG. 6.

Referring to (f) of FIG. 6, an electromagnetic shielding film 647, e.g., a hot melt film, may be attached on the cured stress neutralization material 643. The attached electromagnetic shielding film 647 may be cured by a thermal curing process at a temperature below about 70 degrees Celsius (° C.) under a non-pressure condition, thereby constructing the electromagnetic shielding layer (e.g., 440 of FIG. 4 or 541 of FIG. 5).

The manufactured electromagnetic shielding layer (e.g., 440 of FIG. 4 or 541 of FIG. 5) is illustrated in (g) of FIG. 6.

Figure 7:
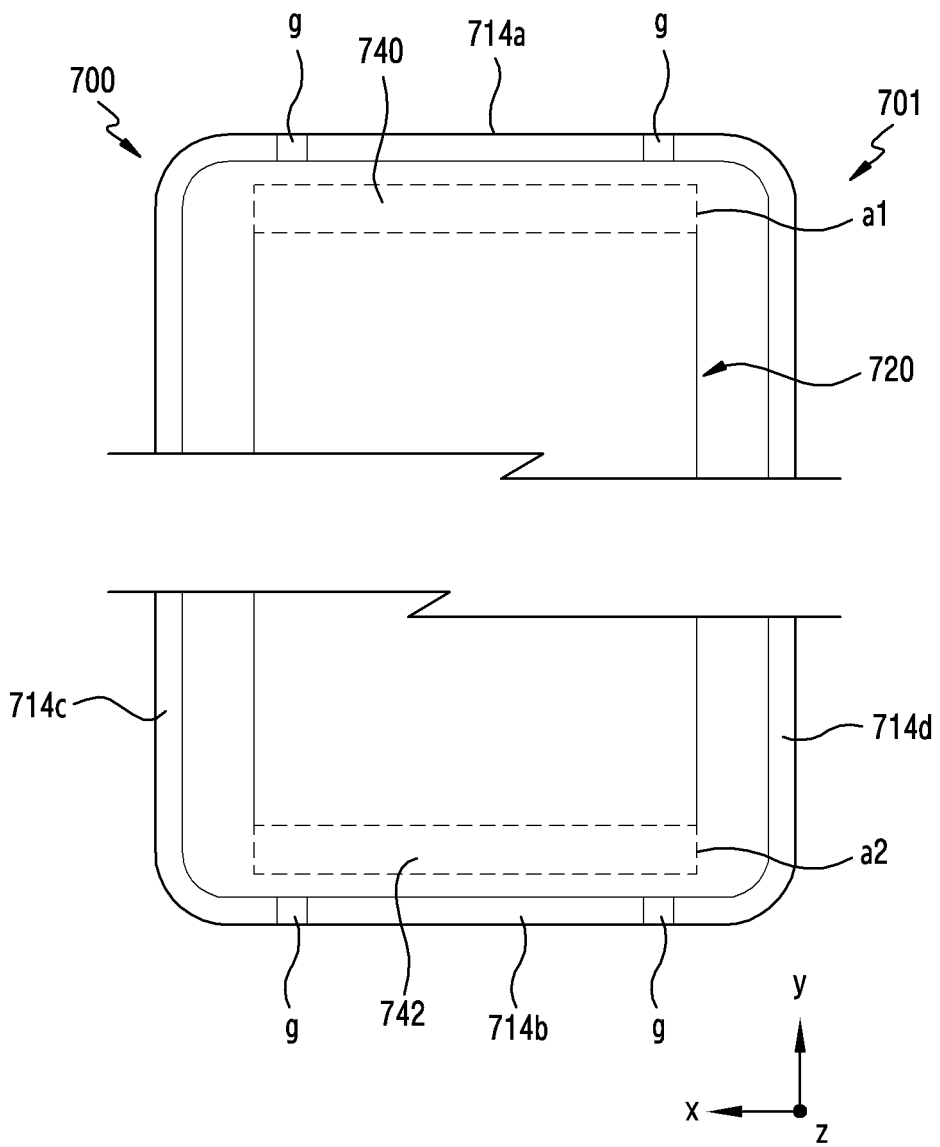
FIG. 7 is an exemplary view schematically illustrating an arrangement state of a side member operating as an antenna radiator of an electronic device according to various embodiments of the disclosure.

Referring to FIG. 7, a housing 701 of an electronic device 700 according to various embodiments may include a plurality of side members 714a to 714d surrounding at least part of a space between first and second covers, serving as part of an exterior of the electronic device 700, and operating as an antenna radiator.

The side members 714a to 714d (e.g., the side member 414 of FIG. 4) according to various embodiments may operate as the antenna radiator by being disposed on a side face of the housing 701 in a segmented shape. Each of the side members 714a to 714d may be constructed to be fed and grounded from a printed circuit board in the housing. For example, the side members 714a to 714d may be disposed respectively to top, bottom, one end, and the other end of the housing in a segmented shape. The side member may include a top-center side member 714a, a bottom-center side member 714b, one side member 714b, and the other side member 714d. The top and bottom side members 714a and 714b may be constructed in a linear shape, and may be disposed on the top side face and bottom side face of the housing 701. The top-center side member 714a may be disposed to have a gap g with respect to the one side member 714c and the other side member 714d, and the bottom-center side member 714 may be disposed to have a gap g with respect to the first side member 714c and the other side member 714d. Each gap g may be filled with a non-metallic material, e.g., an insulating material.

An electromagnetic shielding layer 740 according to various embodiments may be disposed to a first portion of a display panel 720 adjacent to the top-center side member 714a or the bottom-center side member 714b. For example, the first portion may be a portion adjacent to the side members 714a and 714b, i.e., a top portion a1 or bottom portion a2 of the display panel 720. Although not shown, if one side member and the other side member operate as an antenna radiator, an electromagnetic shielding layer may be disposed to one side portion or the other side portion of the display panel. Although not shown, a frequency band of the antenna radiator may be adjusted by adjusting a position of a segmented portion, i.e., a gap, or a distance between a feeding portion and ground portion of the side member.

Figure 8:
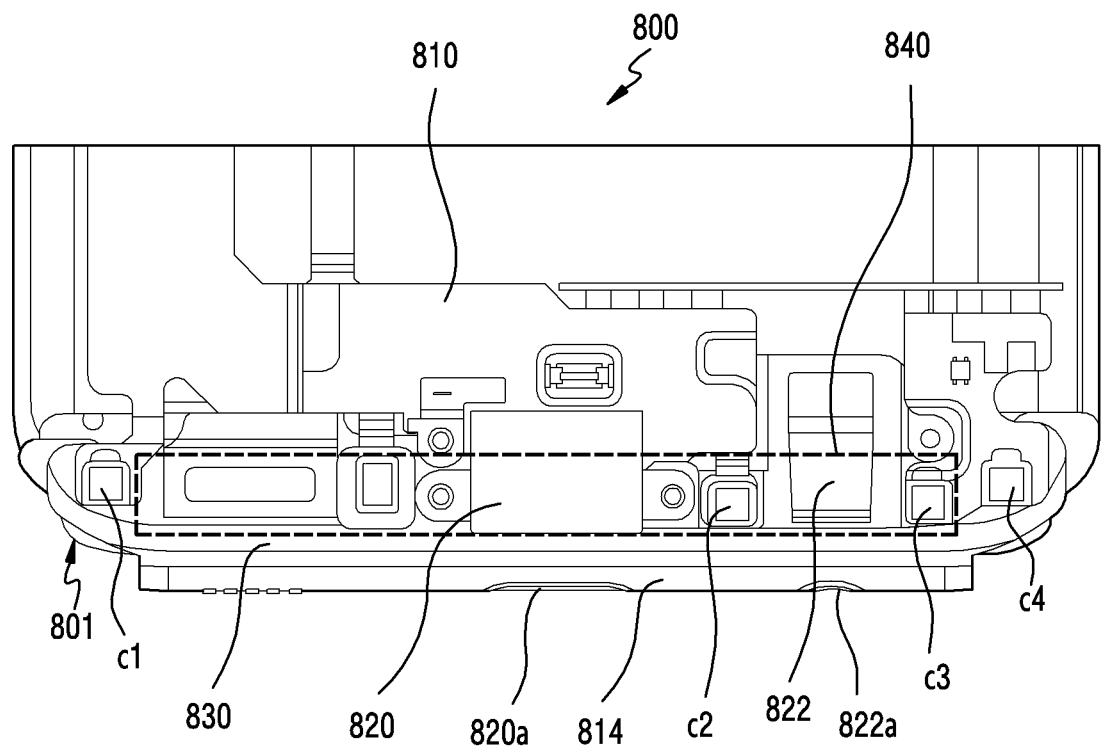
FIG. 8 is a plan view illustrating components disposed to a bottom portion of a housing of an electronic device according to various embodiments of the disclosure.

Referring to FIG. 8, an electronic device 800 according to various embodiments may have various components disposed around a side member 814 (e.g., 414 of FIG. 4A) disposed to a bottom portion of a housing 801. For example, a USB connector 820, an earphone connector 822, and a plurality of connection terminals c1 to c4 may be located at the bottom portion of the housing 801.

The side member 814 according to various embodiments may be constructed of a metal material to operate as an antenna radiator. The side member 814 may face the USB connector 820 at a center portion, face the first connection terminal c1 at one side of the center portion, and face the earphone connector 822 and the second to fourth connection terminals c2 to c4 at the other side. The first to fourth connection terminals c1 to c4 may be used as a ground terminal, feeding terminal, quick charging terminal, or the like of the bottom-center side member 814 operating as an antenna radiator. The USB connector 820 may include a USB connector hole 820a, and the earphone connector 822 may include an earphone connector hole 822a.

An electromagnetic shielding structure 840 according to various embodiments may be disposed to be stacked on the USB connector 820, the earphone connector 822, and the first to fourth connection terminals c1 to c4. Electromagnetic waves generated from a plurality of electronic components mounted on a printed circuit board 810 may adversely affect an operation of an antenna, i.e., the antenna radiator of the bottom-center side member 814. However, an antenna performance degradation can be prevented due to the electromagnetic shielding structure 840. A reference number 830 indicates a support which is combined with the housing to support a variety of electronic components. The support may include, for example, a bracket.

A term "module" used in the disclosure may imply a unit including, for example, one of hardware, software, and firmware or a combination of two or more of them. The "module" may be interchangeably used with a term such as a unit, a logic, a logical block, a component, a circuit, or the like. The "module" may be a minimum unit of an integrally constituted component or may be a part thereof. The "module" may be a minimum unit for performing one or more functions or may be a part thereof. The "module" may be mechanically or electrically implemented. For example, the "module" of the disclosure may include at least one of an Application-Specific Integrated Circuit (ASIC) chip, a Field-Programmable Gate Arrays (FPGAs), and a programmable-logic device, which are known or will be developed and which perform certain operations.

At least some parts of a device (e.g., modules or functions thereof) or method (e.g., operations) based on the disclosure according to various embodiments may be implemented with an instruction stored in a computer-readable storage media. If the instruction is executed by one or more processors, the one or more processors may perform a function corresponding to the instruction. The computer-readable storage media may be, for example, the memory. At least part of the program module may be implemented (e.g., executed), for example, by a processor. At least part of the programming module may include modules, programs, routines, sets of instructions, processes, or the like for performing one or more functions.

The computer readable recording medium may include a hard disk, a floppy disk, magnetic media (e.g., a magnetic tape), optical media (e.g., a Compact Disc-ROM (CD-ROM), a Digital Versatile Disc (DVD), magnetic-optic media (e.g., a floptical disk)), a hardware device (e.g., a Read Only Memory (ROM), a Random Access Memory (RAM), a flash memory, or the like), or the like. An example of the program instruction includes not only a machine language created by a compiler but also a high-level language executable by a computer by using an interpreter or the like. The aforementioned hardware device may be configured to operate as one or more software modules to perform the operation of the disclosure, and the other way around is also possible.

The module or programming module according to the disclosure may further include at least one or more components among the aforementioned components, or may omit some of them, or may further include additional other components. Operations performed by a module, programming module, or other components according to the disclosure may be executed in a sequential, parallel, repetitive, or heuristic manner. Further, some of the operations may be executed in a different order or may be omitted, or other operations may be added.

In addition, various embodiments of the disclosure disclosed in the specification and the drawing are merely a specific example presented for clarity and are not intended to limit the scope of the disclosure. Therefore, in addition to the embodiments disclosed herein, various changes in forms and details made without departing from the technical concept of the disclosure will be construed as being included in the scope of the disclosure.

The invention claimed is:

1. An electronic device comprising:
an antenna disposed in some areas of the electronic device;
a printed circuit board; and
a display module including a display panel, one or more signal lines coupled to the display panel, and a flexible substrate on which the one or more signal lines are disposed, the display panel including an edge having a first curvature;
wherein the flexible substrate includes:
a stress neutralization layer, coupled to the display module, and deformable to a second curvature to accommodate the first curvature of the edge of the display panel,
a conductive shield layer, communicatively coupled to the printed circuit board, coupled to the stress neutralization layer, and having a third curvature accommodating the second curvature of the stress neutralization layer, and
the conductive shield layer configured to shield the antenna from electromagnetic waves radiated from the one or more signal lines,
wherein the stress neutralization layer is disposed between the flexible substrate and the conductive shield layer.

2. The electronic device of claim 1,
wherein the antenna includes at least one side member of the electronic device, which operates as an antenna radiator of the electronic device, and
wherein the conductive shield layer and the stress neutralization layer extend along the side member.

3. The electronic device of claim 2,
wherein a universal serial bus (USB) connector hole is formed in the side member, and
wherein the conductive shield layer and the stress neutralization layer are disposed on the USB connector in a first direction.

4. An electronic device comprising:
a housing including:
a first cover disposed in a first direction,
a second cover disposed in a second direction opposite to the first direction, and
a plurality of side members disposed in a third direction perpendicular to the first and second directions and surrounding at least part of a space between the first and second covers, the plurality of side members constructed of a metal material in a segmented manner so as to operate as an antenna radiator;
a display panel exposed to at least part of the first cover, and disposed adjacent to at least one part of the side member, the display panel including an edge having a first curvature; and
an electromagnetic shielding structure disposed along the edge of the display panel, and having a second curvature so as to at least partially correspond to the first curvature of the display panel.

5. The electronic device of claim 4, wherein a first portion of the display panel includes a flexible substrate.

6. The electronic device of claim 5,
wherein the electromagnetic shielding structure is formed as an electromagnetic shielding layer, and
wherein the flexible substrate includes a curved portion, and the electromagnetic shielding layer is formed in the curved portion.

7. The electronic device of claim 6,
wherein a stress neutralization layer is further disposed between the electromagnetic shielding layer and a flexible substrate of the display panel, and
wherein the stress neutralization layer extends along the electromagnetic shielding layer.

8. The electronic device of claim 6, wherein the electromagnetic shielding layer is formed in a shape of a layer of Ag paste, or constructed by attachment of an ultraviolet curing layer of a film type, and is thermally cured at a temperature below about 70 degrees Celsius.

9. The electronic device of claim 6, wherein the electromagnetic shielding layer is attached to an outer face of the curved portion.

10. The electronic device of claim 5, wherein the electromagnetic shielding structure is disposed adjacent to a universal serial bus (USB) connector, and
wherein the electromagnetic shielding structure is disposed on the USB connector in the first direction.

11. The electronic device of claim 10, wherein a USB connector hole is further formed in a side member facing the electromagnetic shielding structure.

12. The electronic device of claim 4, wherein a specific gap is maintained between the electromagnetic shielding structure and the side member, and
wherein the electromagnetic shielding structure extends along the side member.

13. The electronic device of claim 12,
wherein the display panel is formed of a flexible material, and includes:
a display area; and
a non-display area coupled to the display area so as to contact with the display area, and
wherein the electromagnetic shielding layer is attached to the non-display area.

14. The electronic device of claim 13, wherein the electromagnetic shielding layer is attached to an outer face of the non-display area.

15. The electronic device of claim 4, wherein the side member includes an exterior center side member disposed at a bottom center of the housing, and is coupled to be fed and grounded from a printed circuit board disposed in the housing, so as to operate as an antenna radiator.

* * * * *